(12) United States Patent
Kim et al.

(10) Patent No.: US 10,505,006 B2
(45) Date of Patent: Dec. 10, 2019

(54) PROOF MASS AND POLYSILICON ELECTRODE INTEGRATED THEREON

(71) Applicant: InvenSense, Inc., San Jose, CA (US)

(72) Inventors: Bongsang Kim, Mountain View, CA (US); Jongwoo Shin, Pleasanton, CA (US); Joseph Seeger, Menlo Park, CA (US); Logeeswaran Veerayah Jayaraman, Milpitas, CA (US); Houri Johari-Galle, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/044,233

(22) Filed: Jul. 24, 2018

(65) Prior Publication Data
US 2019/0035905 A1    Jan. 31, 2019

Related U.S. Application Data

(60) Provisional application No. 62/538,586, filed on Jul. 28, 2017.

(51) Int. Cl.
| | |
|---|---|
| *G01P 15/135* | (2006.01) |
| *B81B 7/00* | (2006.01) |
| *B81C 1/00* | (2006.01) |
| *H01L 29/49* | (2006.01) |
| *H01L 23/532* | (2006.01) |

(Continued)

(52) U.S. Cl.
CPC ............ *H01L 29/4933* (2013.01); *B81B 7/00* (2013.01); *B81B 7/0019* (2013.01); *B81B 7/0032* (2013.01); *B81B 7/0035* (2013.01); *B81B 7/0038* (2013.01); *B81B 7/0041* (2013.01); *B81C 1/00* (2013.01); *B81C 1/0015* (2013.01); *B81C 1/0019* (2013.01); *B81C 1/00134* (2013.01); *B81C 1/00158* (2013.01); *B81C 1/00166* (2013.01); *B81C 1/00182* (2013.01); *B81C 1/00238* (2013.01); *B81C 1/00261* (2013.01); *G01C 19/5712* (2013.01); *G01C 19/5719* (2013.01); *G01C 19/5755* (2013.01); *G01C 19/5762* (2013.01); *G01P 15/0802* (2013.01); *G01P 15/097* (2013.01); *G01P 15/125* (2013.01); *G01P 15/13* (2013.01); *G01P 15/135* (2013.01); *H01L 23/53271* (2013.01);

(Continued)

(58) Field of Classification Search
None
See application file for complete search history.

(56) References Cited

U.S. PATENT DOCUMENTS

| | | | |
|---|---|---|---|
| 7,956,302 B1 * | 6/2011 | Jean ..................... | G01P 1/023 200/61.45 R |
| 8,564,076 B1 * | 10/2013 | Huang ................. | B81B 7/0064 257/414 |

(Continued)

*Primary Examiner* — Minh Loan Tran (57) ABSTRACT

A method includes depositing a silicon layer over a first oxide layer that overlays a first silicon substrate. The method further includes depositing a second oxide layer over the silicon layer to form a composite substrate. The composite substrate is bonded to a second silicon substrate to form a micro-electro-mechanical system (MEMS) substrate. Holes within the second silicon substrate are formed by reaching the second oxide layer of the composite substrate. The method further includes removing a portion of the second oxide layer through the holes to release MEMS features. The MEMS substrate may be bonded to a CMOS substrate.

20 Claims, 8 Drawing Sheets

(51) Int. Cl.
*G01P 15/097* (2006.01)
*G01C 19/5712* (2012.01)
*G01C 19/5755* (2012.01)
*G01C 19/5762* (2012.01)
*G01C 19/5719* (2012.01)
*G01P 15/13* (2006.01)
*G01P 15/08* (2006.01)
*G01P 15/125* (2006.01)

(52) U.S. Cl.
CPC .................. *H01L 29/4983* (2013.01); *G01P 2015/0808* (2013.01)

(56) References Cited

U.S. PATENT DOCUMENTS

| | | | |
|---|---|---|---|
| 2012/0313235 A1* | 12/2012 | Chu | B81B 3/0005 257/692 |
| 2015/0266723 A1* | 9/2015 | Chan | H04R 1/08 381/173 |
| 2015/0311178 A1* | 10/2015 | Shin | B81C 1/00238 438/109 |
| 2017/0107100 A1* | 4/2017 | Cheng | B81B 3/0081 |
| 2017/0203962 A1* | 7/2017 | Cheng | B81B 7/0038 |

* cited by examiner

PROOF MASS AND POLYSILICON ELECTRODE INTEGRATED THEREON

CROSS-REFERENCE TO RELATED APPLICATIONS

This application claims the benefit of U.S. Provisional Patent Application Ser. No. 62/538,586 filed Jul. 28, 2017, entitled "Polysilicon Electrode", which is incorporated herein by reference in its entirety.

BACKGROUND

MEMS ("micro-electro-mechanical systems") are a class of devices that are fabricated using semiconductor-like processes. Electrodes on MEMS devices are usually made of non-silicon material and formed on one side of a proof mass. Unfortunately, forming electrode on one side of the proof mass takes advantage of only sensitivity on one side and due to asymmetry causes instability, e.g., thermal instability, etc.

SUMMARY

Accordingly, there is a need to form a stable polysilicon electrode on a proof mass. Moreover, there is a need to optionally form electrodes on two sides of a proof mass to increase the sensitivity by forming a differential architecture and to further provide symmetry between the top and the bottom gap to increase stability, e.g., thermal stability. In other words, there is a need to optionally maintain a proof mass balanced. Accordingly, a stable electrode is formed, from silicon, on the proof mass for vertical gap thereon. Thus, a smaller alignment tolerance between an out of plane sense electrode and the proof mass is achieved.

In some embodiments, a method includes depositing a silicon layer over a first oxide layer that overlays a first silicon substrate. The method further includes depositing a second oxide layer over the silicon layer to form a composite substrate. The composite substrate is bonded to a second silicon substrate to form a micro-electro-mechanical system (MEMS) substrate. Holes within the second silicon substrate are formed by reaching the second oxide layer of the composite substrate. The method further includes removing a portion of the second oxide layer through the holes to release MEMS features. The MEMS substrate may be bonded to a CMOS substrate.

These and other features and advantages will be apparent from a reading of the following detailed description.

DESCRIPTION

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A micro-electro-mechanical systems ("MEMS") device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer, e.g., accelerometer and gyro as an example. Electrodes for the MEMS device are formed on a proof mass using a stable polysilicon. In one optional embodiment, electrodes are formed on two sides of a proof mass to increase the sensitivity by forming a differential architecture and to further provide symmetry between the top and the bottom gap, thereby forming a balanced proof mass with electrode(s) formed thereon. It is appreciated that formation of silicon-silicon electrode improves stability, e.g., thermal stability. Accordingly, a stable electrode is formed, from silicon, on the proof mass for vertical gap thereon. Thus, a smaller alignment tolerance between out of plane sense electrode and proof mass is achieved. Furthermore, stable vertical gap is achieved due to formation of silicon-silicon all capacitive gaps. It is appreciated that use of silicon-silicon bump/contact also improves stiction.

Figure 1A:
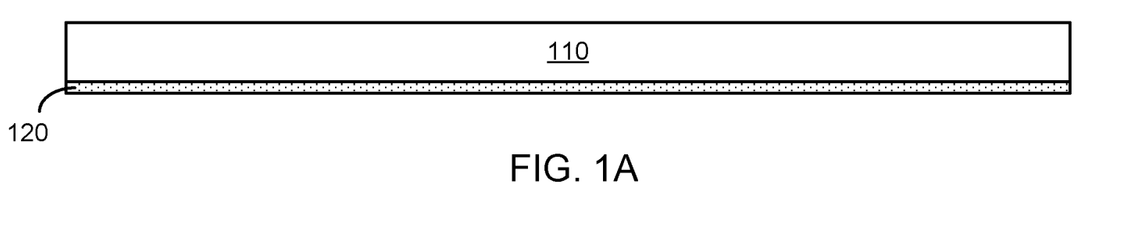
FIGS. 1A-1I show manufacturing a MEMS device according to one aspect of the present embodiments.

FIGS. 1A-1I show manufacturing a MEMS device according to one aspect of the present embodiments. Referring to FIG. 1A, a substrate 110 is shown. The substrate 110 may be a silicon substrate. A layer of oxide 120 is deposited on the substrate 110. The oxide layer 120 may be silicon oxide. In various embodiments, the oxide layer 120 may be deposited by any method, including, but not limited to, physical vapor deposition ("PVD") and chemical vapor deposition ("CVD"). In one example according to some embodiments, an exposed surface of the substrate 110 may be oxidized to form the layer of oxide 120.

Figure 1B:
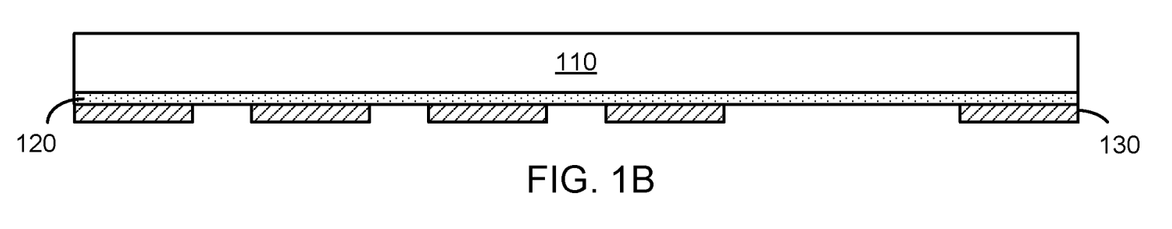

Referring now to FIG. 1B, formation of a silicon layer 130 over the oxide layer 120 is shown. It is appreciated that the silicon layer 130 may be deposited using any method, including, but not limited to PVD, CVD, etc. Once the silicon layer 130 is formed over the oxide layer 120, it may be patterned. It is appreciated that the silicon layer 130 may be patterned using any method including but not limited to a reactive ion etch with a photoresist mask, a dry or wet etch with a photoresist mask or hard mask, etc. It is appreciated that patterning the silicon layer 130 may correspond to polysilicon electrodes.

In the illustrated embodiments, accelerometer and gyro are formed on the same wafer. However, it is appreciated that formation of accelerometer and gyro on the same wafer is for illustrative purposes and should not be construed as limiting the scope of the embodiments. For example, gyro may be formed in one substrate and an accelerometer may be formed in a different substrate.

Figure 1C:
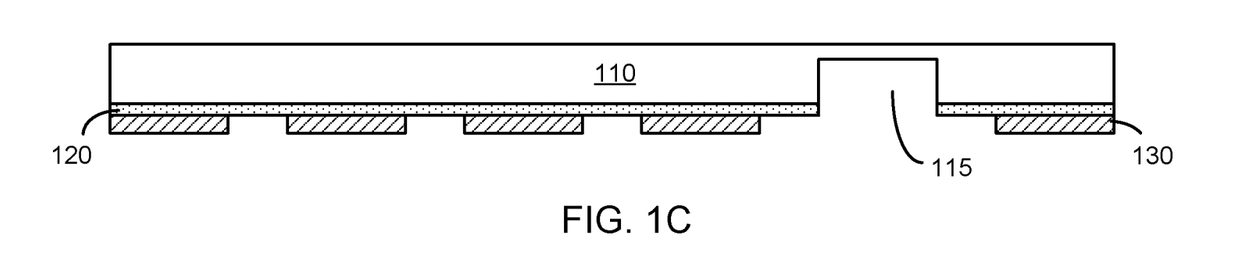
Figure 1D:
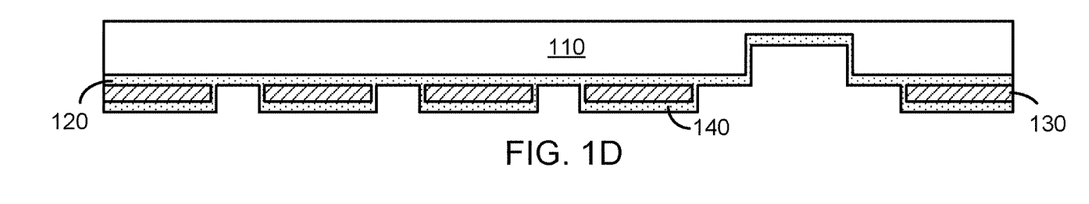

Referring now to FIG. 1C, on the gyro side of the wafer, a cavity 115 is formed therein. Referring now to FIG. 1D, another oxide layer 140 is formed over the patterned silicon substrate 130, the first oxide layer 120 and further on the cavity 115, which forms a composite substrate. The oxide layer 140 may be a silicon oxide layer that is deposited. In various embodiments, the oxide layer 140 may be deposited by any method, including, but not limited to, physical vapor deposition ("PVD") and chemical vapor deposition ("CVD"). In some embodiments, the oxide layer 140 is deposited through fusion bond oxide deposition.

Figure 1E:
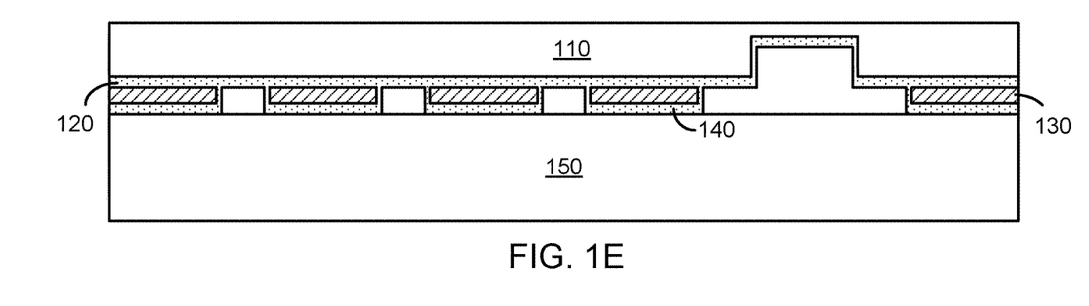

Referring now to FIG. 1E, a silicon substrate 150 is bonded to the silicon substrate 110 with the oxide layer 140, as described in FIG. 1D. In some embodiments, the silicon substrate 150 is fusion bonded and grinded to a desired thickness and standoff height to form the proof mass. Bonding the silicon substrate 150 to the silicon substrate 110, as described above, forms the MEMS substrate.

Figure 1F:
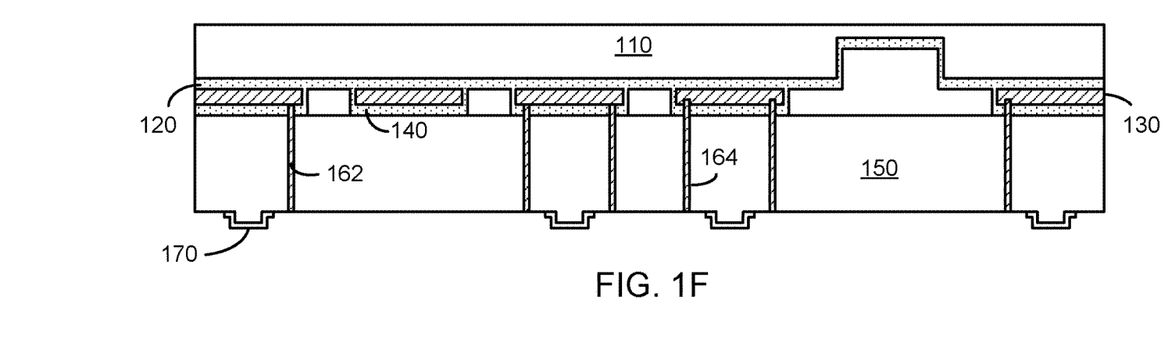

Referring now to FIG. 1F, the standoffs 170 are formed and a layer of material is deposited, e.g., in preparation of eutectic bonding. For example, four standoffs 170 is formed and a layer of Ge is deposited in preparation of the eutectic bonding to a CMOS substrate at a later stage. The standoffs may be formed through various methods including but not limited to a wet etch process, a dry etch process, etc.

In some optional embodiments, the electrical connections are formed through polysilicon vias 162, 164 to provide electrical connection between the composite substrate and the silicon substrate 150. In the illustrated example, six polysilicon vias are formed, e.g., through etching process. The polysilicon vias 162 barely make contact with the oxide layer 130, however, in other some optional embodiments the polysilicon vias 164 go slightly through the oxide layer 130, as depicted. It is appreciated that the polysilicon vias may be formed, as described in the U.S. Pat. No. 8,564,076, which is incorporated herein by reference in its entirety. It is also appreciated that electrical connections may be formed through other means and not necessarily through polysilicon vias. According to some embodiments, the polysilicon vias are electrically conductive by using for example electrically conductive material (e.g. tungsten, aluminum, etc.). In various embodiments, the electrically conductive material may include a barrier metal (e.g. Ti, TiN, etc.) along the edges and surrounding the electrically conductive material. In some embodiments, the vias, e.g., 162 and 164, are filled with polycrystalline silicon.

It is appreciated that in some embodiments, the polysilicon vias are formed prior to patterning the substrate 150 to form the standoffs.

Figure 1G:
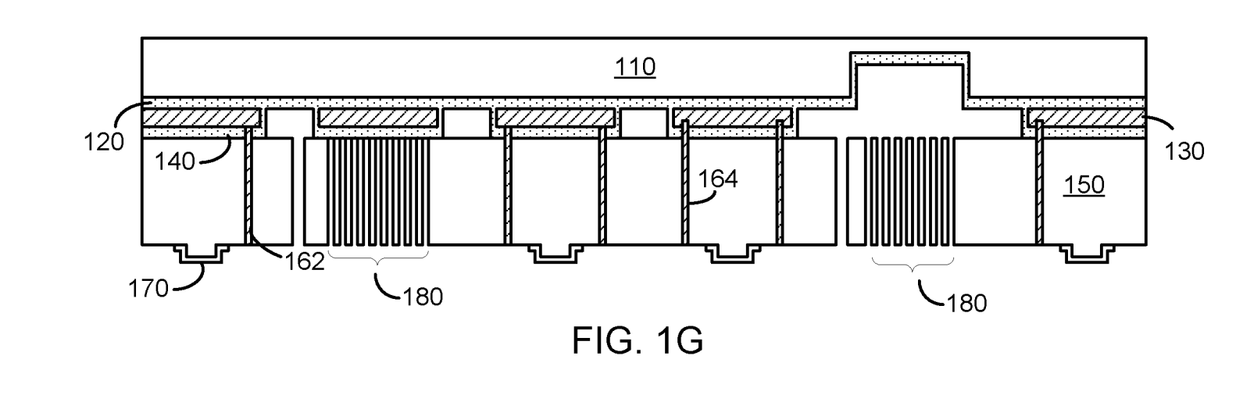
Figure 1H:
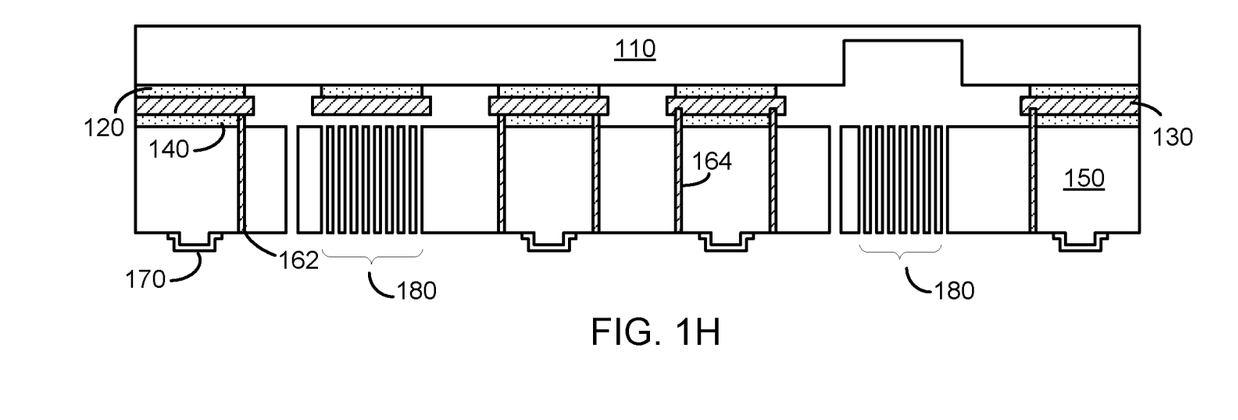

Referring now to FIG. 1G, a plurality of holes 180 are formed. The plurality of holes 180 may be formed through an etching process, in one example. The plurality of holes 180 may be used in vapor HF (VHF) process to selectively remove portions of the oxide layer 140 and/or oxide layer 120 in order to form the MEMS features, as shown in FIG. 1H. For example, through VHF process, a portion of the oxide layer 140 between the silicon layer 130 and the silicon substrate 150 may be removed. Similarly, through VHF process, a portion of the oxide layer 120, e.g., oxide layer 120 on the cavity 115, oxide layer 120 between the silicon layer 130 and the silicon substrate 110, etc. may be removed.

It is appreciated that in some embodiments, self-assembled monolayer (SAM) coating may reduce stiction on movable parts of the MEMS device.

Figure 1I:
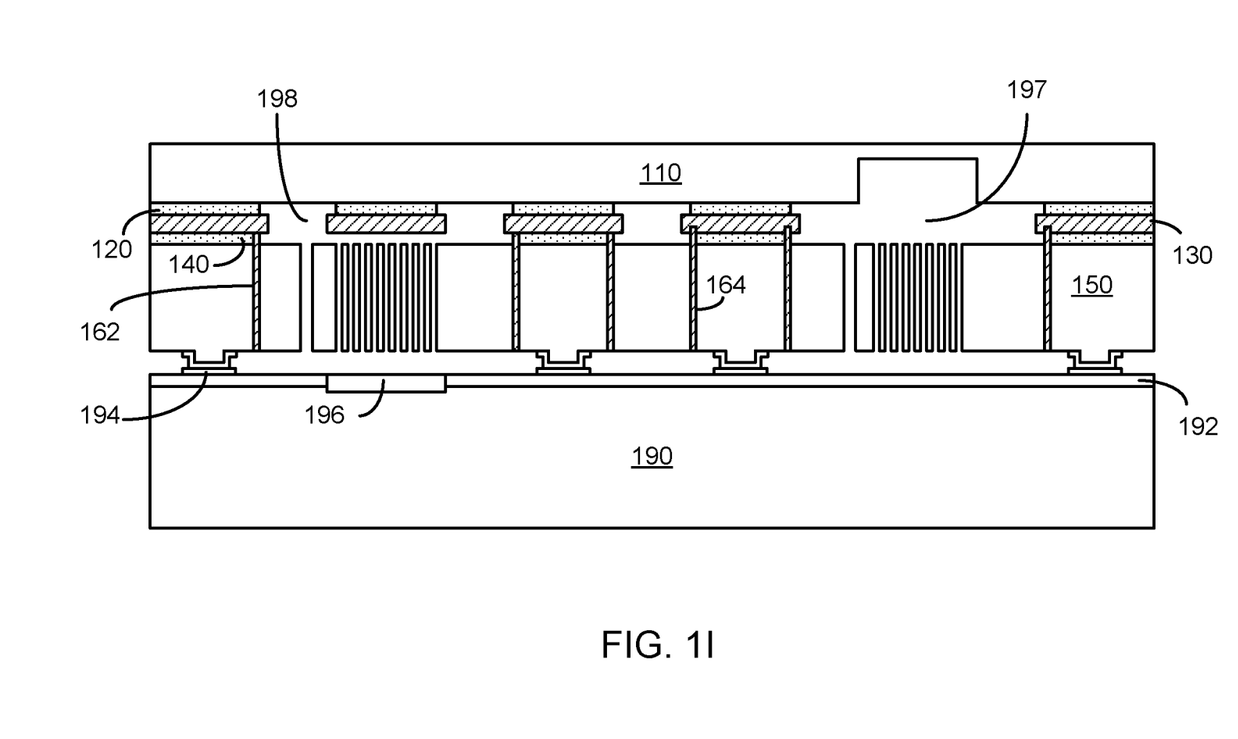

Referring now to FIG. 1I, a CMOS substrate 190 is bonded to the MEMS substrate (silicon substrate 110 coupled to silicon layer 130 coupled to the silicon substrate 150) through eutectic bonding of the created standoffs 170. The CMOS substrate 190 may include a passivation layer 192, e.g., SiN, etc. The CMOS substrate 190 may further include a high density plasma (HDP) 196 area. Eutectic bonding layers 194, e.g., aluminum, may be used to eutectically bond the CMOS substrate 190 to the MEMS substrate where the standoff is coated with Ge, as an example. It is appreciated that while the embodiments are described with respect to eutectically bonding the CMOS substrate 190 to the MEMS substrate, the embodiments are not limited thereto. For example, MEMS substrate may be coupled to the CMOS substrate 190 using other means and use of eutectic bonding is for illustrative purposes.

The eutectic bonding of the CMOS substrate 190 to the MEMS substrate forms a first cavity 197 and a second cavity 198. The first cavity 197 and the second cavity 198 are defined by the CMOS substrate 190 and the MEMS substrate. The first cavity 197 and the second cavity 198 form MEMS devices accelerometer and gyroscope respectively. However, it is appreciated that other forms of MEMS devices may be formed, e.g., magnetometer, pressure sensor, etc. In various embodiments, the first cavity 197 and the second cavity 198 are sealed, for example, by the eutectic bonds. As a result of the sealing, the first cavity 197 forms a first MEMS device that may include a first gas pressure and the second cavity 198 forms a second MEMS device that may include a second gas pressure. In various embodiments, the first gas pressure and the second gas pressure may be different or the same, and one or both of the pressures may be a vacuum.

Figure 2:
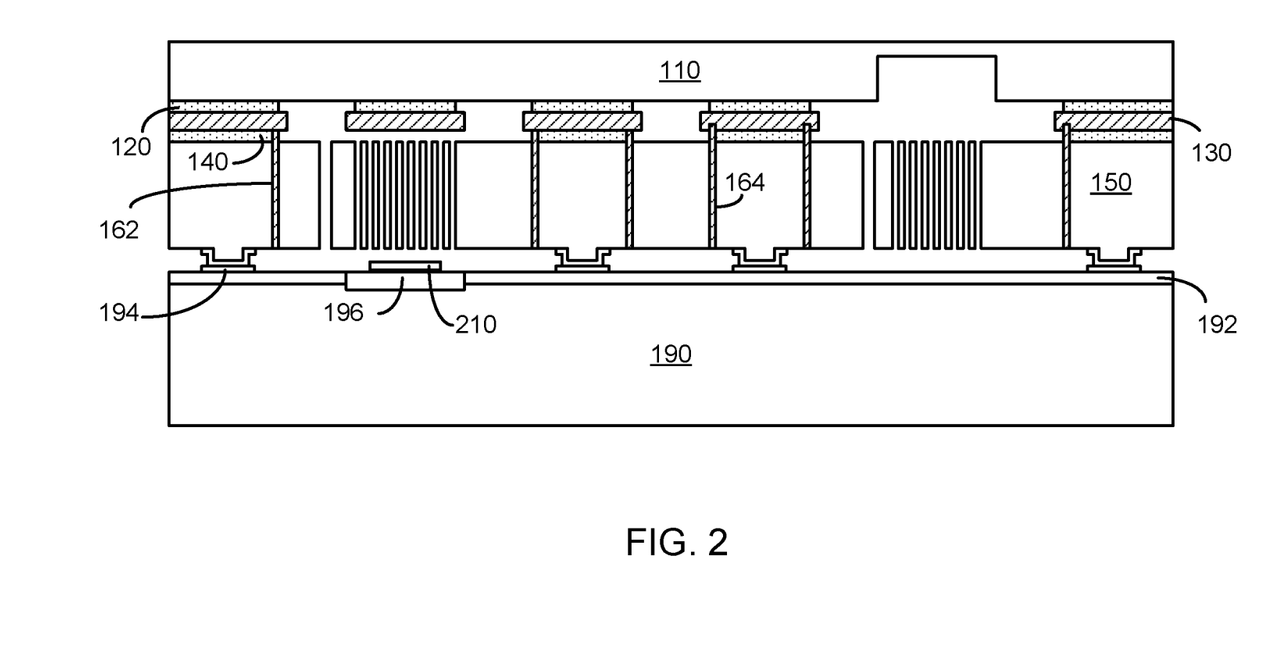
FIG. 2 shows manufacturing a MEMS device according to another aspect of the present embodiments.

FIG. 2 shows manufacturing a MEMS device according to another aspect of the present embodiments. FIG. 2 is substantially similar to that of FIG. 1. However, in the embodiment of FIG. 2, an electrode 210 is formed over the HDP area 196. The electrode 210 may include material such as aluminum. The electrode 210 may be formed to create a balanced proof mass, in one example.

Figure 3:
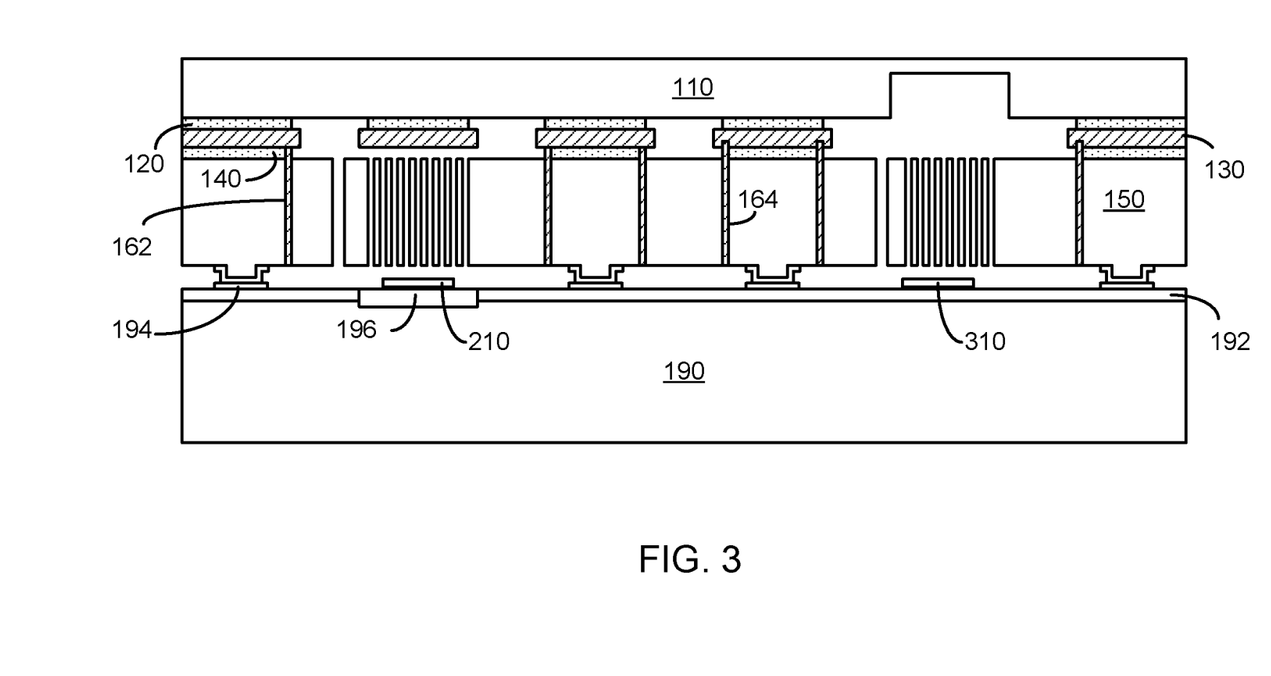
FIG. 3 shows manufacturing a MEMS device according to yet another aspect of the present embodiments.

FIG. 3 shows manufacturing a MEMS device according to yet another aspect of the present embodiments. FIG. 3 is substantially similar to that of FIG. 2. However, in FIG. 3, on the gyroscope side of the MEMS device, getter material 310 may be used. Getter material 310 may include but not limited to Ti.

Figure 4A:
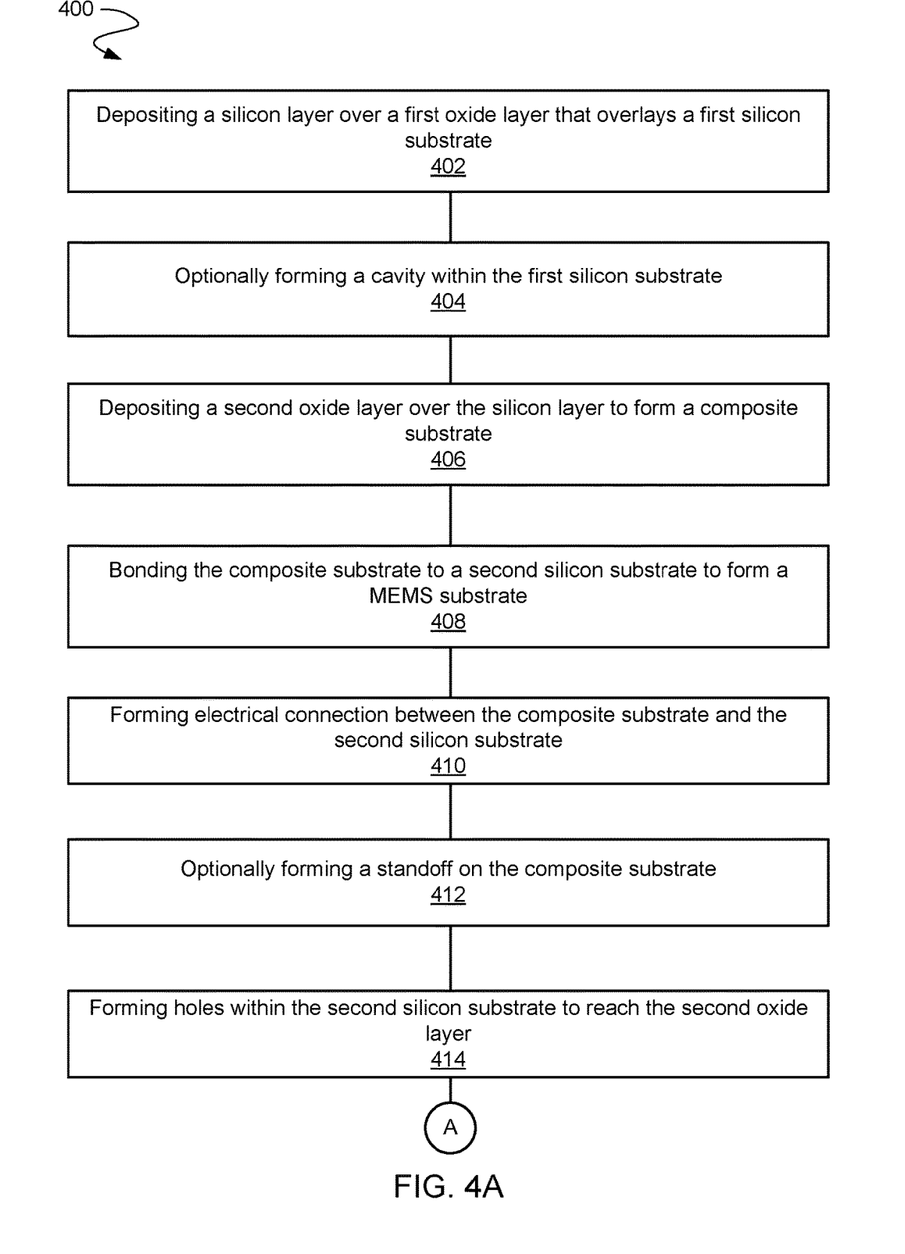
FIGS. 4A-4B show an example of flow diagram for manufacturing a MEMS device according to one aspect of the present embodiments.
Figure 4B:
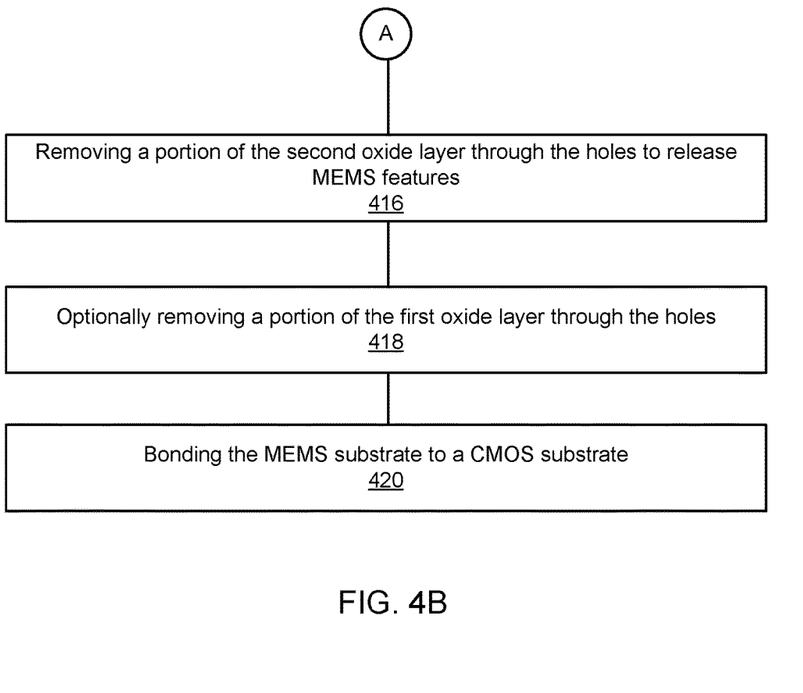

FIGS. 4A-4B show an example of flow diagram for manufacturing a MEMS device according to one aspect of the present embodiments. At step 402, a silicon layer, e.g., silicon layer 130, is deposited over a first oxide layer, e.g., oxide layer 120, that overlays a first silicon substrate, e.g., silicon substrate 110, as shown in FIG. 1B. It is appreciated that the oxide layer 120 may be formed over the first silicon substrate 110 by oxidization, as an example. In some embodiments, the oxide layer 120 may be formed over the first silicon substrate 110 by depositing oxide via various methods such as PVD, CVD, etc.

At step 404, optionally a cavity, e.g., cavity 115, is formed within the first silicon substrate, e.g., silicon substrate 110, as shown in FIG. 1C. It is appreciated that the cavity 115 may be formed to create a gyroscope MEMS device. At step 406, a second oxide layer, e.g., oxide layer 140, is formed over the silicon layer, e.g., silicon layer 130, to form a composite substrate, as shown in FIG. 1D.

At step 408, the composite substrate is bonded to a second silicon substrate, e.g., silicon substrate 150, to form a MEMS substrate, as illustrated in FIG. 1E. At step 410, electrical connection between the composite substrate and the second silicon substrate, e.g., silicon substrate 150, is formed. It is appreciated that in some embodiments, the electrical connection may be formed by creating vias, e.g., vias 162, 164, within the second substrate, e.g., silicon substrate 150, as illustrated in FIG. 1F. It is appreciated that the vias may be filled with polycrystalline silicon.

It is appreciated that, at step 412, a standoff may optionally be formed, e.g., through an etching process, as illustrated in FIG. 1F. In some embodiments, the standoff(s) may be coated material, e.g., Ge, suited for eutectic bonding of the MEMS substrate to a CMOS substrate at a later stage. At step 414, a plurality of holes, e.g., holes 180, is formed within the second silicon substrate, e.g., silicon substrate 150, as illustrated in FIG. 1G. The holes 180 reach the second oxide layer, in some examples.

At step 414, a portion of the second oxide layer, e.g., oxide layer 140, is removed through the holes in order to release the MEMS features, as illustrated in FIG. 1H. For example, portions of the oxide layer 140 that is between the silicon layer 130 and the second silicon substrate 150 may be removed. It is appreciated that the MEMS features may be released through a VHF process. It is appreciated that at step 418, optionally a portion of the first oxide layer, e.g., oxide layer 120, is removed through the holes, as illustrated in FIG. 1H. For example, portions of the oxide layer 120 that is between the silicon layer 130 and the first silicon substrate 110 is optionally removed.

At step 420, the MEMS substrate is bonded to the CMOS substrate, as illustrated in FIG. 1I as an example. It is appreciated that while the embodiments illustrate eutectic bonding of the MEMS substrate to the CMOS substrate, the embodiments should not be construed as limited thereto. For example, the MEMS substrate may be bonded to the CMOS substrate through means other than eutectic bonding.

Accordingly, electrodes for the MEMS device is formed on a proof mass using a stable polysilicon. In one optional embodiment, electrodes are formed on two sides of a proof mass to increase the sensitivity by forming a differential architecture and to further provide symmetry between the top and the bottom gap, thereby forming a balanced proof mass with electrode(s) formed thereon. It is appreciated that formation of silicon-silicon electrode improves stability, e.g., thermal stability. Accordingly, a stable electrode is formed, from silicon, on the proof mass for vertical gap thereon. Thus, smaller alignment tolerance between out of plane sense electrode and proof mass is achieved. Furthermore, stable vertical gap is achieved due to formation of silicon-silicon all capacitive gaps. It is appreciated that use of silicon-silicon bump/contact also improves stiction.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
depositing a silicon layer over a first oxide layer that overlays a first silicon substrate;
depositing a second oxide layer over the silicon layer to form a composite substrate;
bonding the composite substrate to a second silicon substrate to form a micro-electro-mechanical system (MEMS) substrate;
forming holes within the second silicon substrate reaching the second oxide layer of the composite substrate;
removing a portion of the second oxide layer through the holes to release MEMS features; and
bonding the MEMS substrate to a CMOS substrate.

2. The method as described in claim 1 further comprising removing a portion of the first oxide layer through the holes.

3. The method as described in claim 1 further comprising forming vias from the second silicon substrate to the first silicon layer to provide electrical connection between the second silicon substrate and the composite substrate.

4. The method as described in claim 3 further comprising filling the vias with polycrystalline silicon.

5. The method as described in claim 3, wherein the forming the vias is through an etching process.

6. The method as described in claim 1 further comprising forming a standoff through patterning and etching process.

7. The method as described in claim 6 further comprising depositing Germanium on the standoff for eutectically bonding the MEMS substrate to the CMOS substrate.

8. The method as described in claim 1, wherein the removing the portion of the second oxide layer through the holes to release MEMS features is through a vapor HF etching process.

9. A method comprising:
depositing a silicon layer over a first oxide layer that overlays a first silicon substrate;
forming a cavity within the first silicon substrate;
depositing a second oxide layer over the silicon layer and further over the cavity to form a composite substrate;
bonding the composite substrate to a second silicon substrate to form a micro-electro-mechanical system (MEMS) substrate;
forming holes within the second silicon substrate reaching the second oxide layer of the composite substrate;
removing a portion of the second oxide layer through the holes to release MEMS features; and
bonding the MEMS substrate to a CMOS substrate.

10. The method as described in claim 9 further comprising removing a portion of the first oxide layer through the holes.

11. The method as described in claim 9 further comprising forming vias from the second silicon substrate to the first silicon layer to provide electrical connection between the second silicon substrate and the composite substrate.

12. The method as described in claim 11 further comprising filling the vias with polycrystalline silicon.

13. The method as described in claim 11, wherein the forming the vias is through an etching process.

14. The method as described in claim 9 further comprising forming a standoff through patterning and etching process.

15. The method as described in claim 14 further comprising depositing Germanium on the standoff for eutectically bonding the MEMS substrate to the CMOS substrate.

16. The method as described in claim 9, wherein the removing the portion of the second oxide layer through the holes to release MEMS features is through a vapor HF etching process.

17. A method comprising:
    depositing a silicon layer over a first oxide layer of a first silicon substrate;
    forming an oxidized layer over the silicon layer to form a composite substrate;
    bonding the composite substrate to a second silicon substrate to form a micro-electro-mechanical system (MEMS) substrate;
    forming holes within the second silicon substrate, wherein the holes make contact with the second oxide layer of the composite substrate; and
    removing a portion of the second oxide layer through the holes to release MEMS features.

18. The method as described in claim 17 further comprising bonding the MEMS substrate to a CMOS substrate.

19. The method as described in claim 17 further comprising forming a cavity within the first silicon substrate.

20. The method as described in claim 17, wherein the removing the portion of the second oxide layer through the holes to release MEMS features is through a vapor HF etching process.

* * * * *